United States Patent
Knopp et al.

(10) Patent No.: US 11,619,089 B2
(45) Date of Patent: Apr. 4, 2023

(54) METHOD FOR ADJUSTING A FORCE THAT HAS TO BE APPLIED BY A USER TO OPERATE A LID

(71) Applicant: Stabilus GmbH, Koblenz (DE)

(72) Inventors: Michael Knopp, Royal Oak, MI (US); Dave Sabet, Koblenz (DE)

(73) Assignee: Stabilus GmbH, Koblenz (DE)

( * ) Notice: Subject to any disclaimer, the term of this patent is extended or adjusted under 35 U.S.C. 154(b) by 910 days.

(21) Appl. No.: 16/432,456

(22) Filed: Jun. 5, 2019

(65) Prior Publication Data

US 2019/0381871 A1    Dec. 19, 2019

Related U.S. Application Data

(60) Provisional application No. 62/685,464, filed on Jun. 15, 2018.

(51) Int. Cl.
| | |
|---|---|
| *E05F 15/611* | (2015.01) |
| *B60J 5/10* | (2006.01) |
| *B62D 25/12* | (2006.01) |
| *G01R 19/165* | (2006.01) |

(52) U.S. Cl.
CPC ............ *E05F 15/611* (2015.01); *B60J 5/101* (2013.01); *B62D 25/12* (2013.01); *G01R 19/1659* (2013.01); *E05Y 2900/548* (2013.01)

(58) Field of Classification Search
CPC .... B60J 5/10; B60J 5/101; B60J 5/102; E05F 15/00; E05F 15/41; E05F 15/611; G01R 19/1659
USPC ................ 296/50, 56, 146.4, 146.8
See application file for complete search history.

(56) References Cited

U.S. PATENT DOCUMENTS

| | | | | |
|---|---|---|---|---|
| 6,755,458 | B1* | 6/2004 | Oberheide | E05F 15/63 |
| | | | | 296/76 |
| 7,808,197 | B2* | 10/2010 | Kimura | B60J 5/10 |
| | | | | 318/469 |
| 10,738,525 | B2* | 8/2020 | Goto | E05F 15/611 |
| 2010/0213732 | A1* | 8/2010 | Ablabutyan | B60J 5/10 |
| | | | | 49/506 |
| 2013/0024076 | A1 | 1/2013 | Fukui et al. | |

(Continued)

FOREIGN PATENT DOCUMENTS

| | | |
|---|---|---|
| DE | 102007062473 A1 | 7/2009 |
| EP | 3153651 A1 | 4/2017 |

(Continued)

OTHER PUBLICATIONS

European Patent Application No. EP19179701.8, Extended European Search Report, dated Nov. 19, 2019, 7 pages.

(Continued)

*Primary Examiner* — Jason S Daniels
(74) *Attorney, Agent, or Firm* — Kilpatrick Townsend & Stockton LLP

(57) ABSTRACT

The invention relates to an operational force support device that is adapted to support a user when operating a lid (10). The invention further relates to a method for adjusting a force ($F_H$) that has to be applied by a user to operate a lid (10). Furthermore, the invention relates to a computer module adapted to output an amplification factor and/or an armature voltage that is/are used in the method according to the invention.

12 Claims, 3 Drawing Sheets

(56) References Cited

U.S. PATENT DOCUMENTS

| | | | |
|---|---|---|---|
| 2015/0096233 A1* | 4/2015 | Kojima | H02P 3/14 49/31 |
| 2016/0177609 A1* | 6/2016 | Nishikibe | E05F 15/40 49/31 |
| 2017/0081900 A1* | 3/2017 | Watanabe | E05F 15/73 |

FOREIGN PATENT DOCUMENTS

| | | | |
|---|---|---|---|
| JP | 2005336772 A | 12/2005 |
| JP | 2013023867 A | 2/2013 |
| JP | 2015074907 A | 4/2015 |
| JP | 2015229868 A | 12/2015 |
| JP | 2016113861 A | 6/2016 |
| JP | 2016532794 A | 10/2016 |

OTHER PUBLICATIONS

Japanese Application No. JP2019-078103, Japanese Office Action dated Mar. 12, 2021, 9 pages.
Japanese Application No. JP2019-078103, Japanese Office Action dated Sep. 3, 2021, 6 pages.

* cited by examiner

METHOD FOR ADJUSTING A FORCE THAT HAS TO BE APPLIED BY A USER TO OPERATE A LID

The invention relates to an operational force support device that is adapted to support a user when operating a lid. The invention further relates to a method for adjusting a force that has to be applied by a user to operate a lid. Furthermore, the invention relates to a computer module adapted to output an amplification factor and/or an armature voltage that is/are used in the method according to the invention.

A situation in which a lid has to be operated by a user is, for example, a trunk lid of a vehicle in order to get access to or close the trunk of the vehicle. As this example is of particular importance for the applicant of the present invention, examples of the present invention are described in the following with respect to a trunk lid that is articulated on a vehicle body of a vehicle, e.g. a car. Also, only one or a plurality of actuators may be coupled to a lid. In the following, the examples of the present invention are described referring to only one actuator. It is to be understood that the scope of the present invention is not limited to this example by any means.

Prior art lids often comprise actuators including a drive unit that are adapted to actuate the lid with respect to the vehicle body. Usually, these actuators are adapted to actuate the lid automatically, e.g. without the need of manual assistance by a user.

In order to retain the lid in any desired position within the complete movement range of the lid, these actuators require passive elements, such as coil springs or brakes. The required forces to retain the lid in the desired position, and therefore the selection of these passive elements, may depend on the weight of the lid and the center of gravity of the lid.

Sometimes, a user needs to move the lid by hand without activating the actuator. Based on e.g. the selection of the passive elements, the weight of the lid, the center of gravity of the lid, and frictional forces in the hinge of the lid, a user has to apply a certain amount of manual forces when moving the lid by hand.

In prior art systems these forces are preset once when manufacturing the vehicle and may not be adapted afterwards on an individual level.

It is therefore an object of the present invention to provide an operational force support device adapted to support a user in moving the lid, and adapted to allow an adjustment of the operational forces after the manufacturing of the vehicle.

This object is solved by the present invention by providing an operational force support device, comprising an actuator that comprises a drive unit, a lid that the actuator is coupled to, and a unit to which the lid is linked in a movable manner, wherein the actuator is adapted to actuate the lid with respect to the unit that the lid is linked to, a detection unit that the actuator is connected to and that is adapted to detect a speed of the drive unit of the actuator, while the lid is manually operated, and an angle that the lid is situated in with respect to the unit that the lid is linked to, a determination unit that the detection unit is connected to and that is adapted to determine an armature voltage, at which the drive unit of the actuator shall be actuated, in dependence on the speed of the drive unit of the actuator and the angle of the lid with respect to the unit that the lid is linked to or to determine an amplification factor in dependence on the speed of the drive unit of the actuator and the angle of the lid with respect to the unit that the lid is linked to, based on which the armature voltage is determined, and an output unit that is connected to the determination unit and that is adapted to output the armature voltage to the drive unit of the actuator such that the drive unit of the actuator generates a supporting torque depending on the armature voltage.

Hence, by moving the drive unit passively, i.e. by driving the drive unit due to a manual movement of the lid, the detection unit detects the speed of the drive unit of the actuator. Based on the detected speed of the drive unit and an angle of the lid with respect to the vehicle body, which is also detected by the detection unit, the determination unit is able to determine the armature voltage based on a preset of operational supporting forces that support the movement of the lid by a user and thus reduces the operational forces that a user has to apply in order to move the lid.

The device may be adjusted in a way that the operational force support device actuates the actuator in dependence on the angle of the lid with respect to the vehicle body such that the manual force that the user has to apply to move the lid is constant over the complete range of movement of the lid and such that the movement of the lid requires the user to apply different manual forces in dependence of the angle of the lid with respect to the vehicle body to move the lid.

When the operational force support device already actuates the actuator in order to support a user in moving the lid, the drive unit of the actuator is driven with a certain speed based on an armature voltage applied to the drive unit. The speed of the drive unit which is caused by an armature voltage applied to the drive unit in order to support the user in moving the lid and not by the user itself has to be taken into account when performing a further iteration of determining supporting forces. In this case, determining the armature voltage which shall be applied to the drive unit of the actuator comprises:

determining the speed the drive unit is already driven by the operational force support device, e.g. due to an applied armature voltage based on a previous supporting action, determining the actual speed that the drive unit is driven by detecting this speed by the detection unit, and determining the preset manual operational force that a user is intended to apply to the lid in dependence on the angle that the lid is currently situated in.

The operational forces may be calculated based on a torque, which is applied by the actuator based on the speed of the drive unit of the actuator and the armature voltage applied to the drive unit of the actuator, and on a preset torque that a user is intended to apply in order to move the lid in dependence on the angle of the lid with respect to the vehicle body.

If the sum of the speed/torque of the actuator resulting from the actuation of the actuator by the operational force support device and the speed/torque of the actuator that is desired as manual operational force based on a preset is lower than an actual detected speed/torque of the actuator, the operational force support device has to increase the armature voltage in order to reduce the manual operational forces applied by a user to the desired level when moving the lid at a specific angle and velocity with respect to the vehicle body.

It is to be noted at this point that, based on the geometry of the vehicle body, the lid, and the actuator, the actuator may have to be driven at different speeds in dependence of the angle of the lid with respect to the vehicle body in order to move the lid with a constant velocity over the complete range of movement of the lid.

Advantageously, the supporting torque generated by the drive unit of the actuator may be below a torque that is necessary to move the lid at the detected speed solely by the drive unit of the actuator. Therefore, to move the lid, an additional torque has to be applied by the user manually. It may thus be prevented that the actuator moves the lid on its own but always requires manual operational forces applied by a user in order to move the lid.

In an embodiment of the present invention, the operational force support device may further comprise a temperature sensor adapted to detect temperature in the vicinity of the actuator and/or an inclination sensor adapted to detect an angle that the unit that the lid is linked to is situated in with respect to the gravity direction. Both the temperature in the vicinity of the actuator and the inclination of the vehicle body may affect a torque that is needed to move the lid in dependence on the angle of the lid with respect to the vehicle body.

The detected temperature and/or the detected inclination of the vehicle body may then be taken into account by the determination unit when determining the armature voltage or the amplification factor, respectively.

In an embodiment of the present invention, the operational force support device may further comprise a storage unit in which a look-up table is stored comprising specific values of armature voltages and/or amplification factors in dependence on at least the angle of the lid with respect to the unit that the lid is linked to, i.e. the vehicle body. This may allow to simply choose a specific value in dependence on at least the angle of the lid instead of calculating it. This may reduce the complexity of the system and the calculation effort of the operational force support device. The look-up table may also take into account the temperature in the vicinity of the actuator and/or the inclination of the vehicle body with respect to the gravity direction and/or a velocity in which the lid is moved.

In an embodiment of the present invention the actuator may be a linear spindle drive. Linear spindle drives are most common in the application field of moving trunk lids of a vehicle. Of course, the operational force support device and/or the method according to the present invention may be implemented in all kinds of actuators, e.g. rotary drives, linear drives, scissor drives, hydraulic drives, pneumatic drives, and the like.

In a second aspect, the present invention relates to a method for adjusting a force that has to be applied by a user to operate a lid, wherein an actuator that is adapted to actuate the lid is coupled to the lid, wherein the method comprises: providing the lid, on which the actuator is disposed, detecting the speed of a drive unit of the actuator, while the lid is manually operated, and an angle that the lid is situated in with respect to a unit that the lid is linked to, determining an amplification factor in dependence on the speed of the drive unit of the actuator and the angle of the lid with respect to the unit that the lid is linked to, determining an armature voltage at which the drive unit of the actuator shall be actuated, outputting the armature voltage to the drive unit of the actuator such that the drive unit of the actuator generates a supporting torque depending on the armature voltage.

It shall be mentioned already at this point that all features and advantages described with respect to the operational force support device may also be applied to the method for adjusting a force according to the present invention, and vice versa.

As described with respect to the operational force support device, the method according to the present invention allows an adjustment of a manual force that has to be applied by a user to operate a lid of a vehicle by comparing the current speed or torque of the actuator with a predetermined torque or force, i.e. a presetting of manual operational forces, a user is intended to apply in order to move the lid.

As this presetting of forces may merely be based on values of an algorithm and not on a hardware setup, the forces that have to be applied by a user may be adjusted at any time after the manufacturing of the vehicle by adjusting these values.

The amplification factor based on which the armature voltage is determined using the formula $$u_A = i*R + K*\theta*n_M \qquad (1)$$

Wherein $u_A$ is the armature voltage, i is the current applied, R is the resistance of the electric system, K is the amplification factor, $\theta$ is the moment of inertia, and $n_M$ is the manual speed of the drive unit that a user shall apply to the lid to move it.

Advantageously, the supporting torque generated by the drive unit of the actuator may be below a torque unit that is necessary to move the lid at the detected speed solely by the drive unit of the actuator. In doing so, the actuator is not capable of actuating the lid on its own but always requires additional manual operational forces applied by a user in order to move the lid. The actuator may here be understood as a pure supporting device.

The method according to the present invention may further comprise detecting an angle that the unit to which the lid is connected is situated in with respect to the gravity direction. That is, detecting an inclination of the vehicle body that the lid is linked to. Since the torque that is needed to move the lid is different in dependence on the angle of the lid with respect to the vehicle body, due to correspondingly changing leverage forces of the center of gravity of the lid to an articulation point of the lid on the vehicle body, an inclination of the vehicle body may affect this leverage and thus the torque that is needed to move the lid in dependence on the angle of the lid.

Furthermore, the method according to the present invention may further comprise detecting a temperature in the vicinity of the actuator. Since the components of the actuator may shrink or expand due to temperature changes and/or the friction between components that move relatively to each other may change due to temperature changes, the temperature in the vicinity of the actuator may be taken into account when determining the torque that has to be applied by the user in order to move the lid, i.e. when determining the armature voltage that is to be applied to the drive unit of the actuator in order to support the user in moving the lid.

Advantageously, determining an amplification factor may comprise selecting a value from a look-up table in dependence on at least the angle of the lid with respect to the unit that the lid is linked to, i.e. the vehicle body. By simply choosing an amplification factor from a plurality of values within the look-up table, the process of determining the amplification factor may be less complex compared to calculating the amplification factor using formulas and equations.

In addition or as an alternative, determining an armature voltage at which a drive unit of the actuator shall be actuated may comprise selecting a value from a look-up table in dependence on at least the speed of the drive unit of the actuator and the amplification factor. As described above, the amplification factor may also be selected from a look-up table. Also, instead of or in addition to the speed of the drive unit, the torque that is generated by the drive unit may be considered when selecting the value from the look-up table.

This may further reduce the complexity or the calculation effort according to the present invention.

The amplification factor and/or the armature voltage may be selected based on a presetting that defines a specific operation force in dependence on at least the lid angle. This presetting may for example be adjusted by a user, by a manufacturer of the vehicle, by a distributer of the vehicle, by a service provider for the vehicle or the like. The presetting may comprise a specific manual operation force that a user has to apply to move the lid for each angle of the lid with respect to the vehicle body or at least a plurality of value-angle-correlations, e.g. a value for every 1°.

The method and the operational force support device, respectively, may be adapted to interpolate operational forces for angles of the lid with respect to the vehicle body that lie between two given angles of the presetting. In addition or as an alternative, the presetting may comprise a graphical curve that defines the operation force in dependence on the angle of the lid.

The presetting may be adjusted or input via a human-machine-interface.

As stated at the beginning of the description of the present invention, the lid may be a trunk lid of a vehicle adapted to grant or prevent access to the trunk of the vehicle. It shall be noted again that the present invention is not limited to lids that close a container or space, but the term "lid" shall be understood as an actuated part that is coupled to another part in a movable manner, e.g. windows, doors etc.

In a further aspect, the present invention relates to a computer module adapted to output an amplification factor and/or an armature voltage that is/are used in the method according to the present invention described above based on an input, performed by a user, of a manual operation force of a lid in dependence of an angle of the lid with respect to a unit that the lid is linked to, i.e. a vehicle body. The computer module according to the present invention may comprise at least some of the features described above and may comprise a storage unit containing the above-mentioned look-up table.

A user of the computer module may input a desired manual operational force, i.e. a presetting of manual operational forces/torques required to move the lid in dependence on the angle of the lid with respect to the vehicle body. The computer module may control the torque generated by the actuator by outputting a specific armature voltage to the drive unit of the actuator based on the detected speed of the drive unit and an angle of the lid and/or a temperature in the vicinity of the actuator and/or an inclination of the vehicle body.

Advantageously, the input may comprise a graphical curve that defines the operation force in dependence on the angle of the lid. By defining a graphical curve of operational forces in dependence on specific angles of the lid with respect to the vehicle body, the user of the computer module may adjust the presetting of the operational forces that are required for a user of the lid to move the lid using a graphic user interface (GUI). This may provide an intuitive way for the user of the computer module to adjust the presetting of manual operational forces.

In the following the present invention will be described with respect to the attached drawings, in which.

Figure 1:
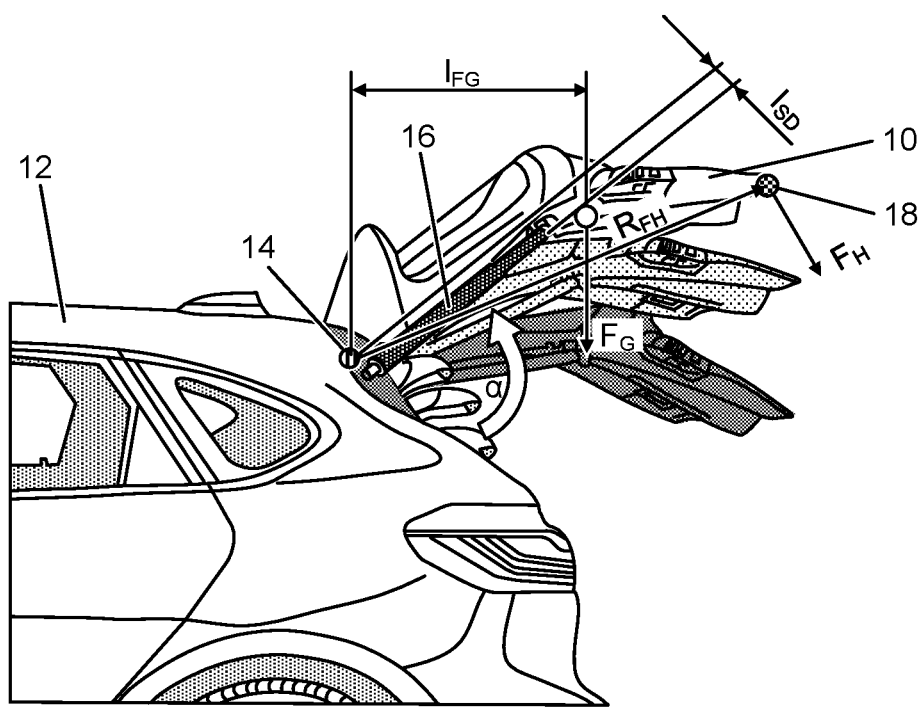
FIG. 1 shows a rear part of a vehicle including applied forces and leverages.

In FIG. 1 a trunk lid 10 is articulated on a vehicle body 12 at a pivot point 14. At the center of gravity of the lid 10 a gravity force $F_G$ is applied to the lid 10 with a leverage $l_{FG}$ of the gravity force $F_G$ to the pivot point 14.

An actuator 16 is coupled on its one end to the lid 10 and to the vehicle body 12 on its other end. In FIG. 1 only one actuator 16 is shown but it is to be understood that a second actuator may be disposed on the other longitudinal side of the vehicle body 12. Of course, in case of a plurality of actuators, the supporting forces have to be distributed to the actuators accordingly. A leverage of the coupling point of the actuator 16 at the lid 10 to the pivot point 14 is described by the distance $l_{SD}$.

An angle of the lid 10 with respect to the vehicle body 12 is denoted in FIG. 1 by an angle α.

Furthermore, a force $F_H$ that has to be applied by a user in order to move the lid 10 with respect to the vehicle body 12 is shown at a handle point 18 at the lid 10. The distance of the handle point 18 to the pivot point 14 is indicated by the radius $R_{FH}$.

When a user moves the lid 10 in the direction of the arrow $F_H$ at the handle point 18 of the lid 10, the actuator 16, which is a linear spindle drive in the shown embodiment, is reduced in length. This results in a rotation of a spindle or a spindle nut, whichever is driven by the drive unit of the spindle drive, and therefore in a passive activation of the drive unit, e.g. in a rotation of a drive shaft of an electric motor. A speed n generated in the drive unit, i.e. here in the electric motor, is detected by a detection unit 20. The detection unit 20 also detects the angle α of the lid 10 with respect to the vehicle body 12, e.g. by using corresponding sensors.

The detected speed n of the drive unit of the actuator and the detected angle α of the lid 10 are forwarded to a determination unit 22 that is adapted to determine an armature voltage $u_A$ at which the drive unit of the actuator shall be actuated in dependence of the speed n of the drive unit of the actuator and the angle α of the lid 10. The determination unit 22 may also determine an amplification factor K based on which the armature voltage $u_A$ is determined using the formula $$u_A = i*R + K*\theta*n_M \quad (1)$$

Wherein i is the current applied, R is the resistance of the electric system, θ is the moment of inertia, and $n_M$ is the manual speed of the drive unit that a user shall apply to the lid to move it.

Figure 2:
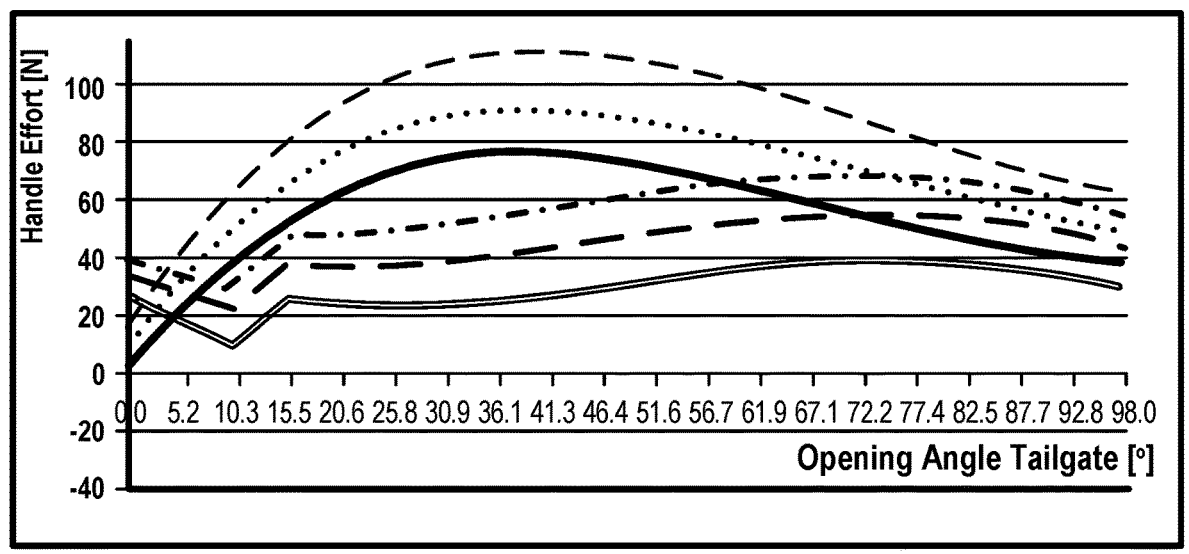
FIG. 2 shows a plurality of graphical curves of operational forces in dependence of angles of the lid.

The determination unit 22 may comprise a look-up table including a presetting of values of manual operational forces $F_H$ in dependence on angles α of the lid 10 with respect to the vehicle body 12. This presetting may comprise a graphical curve indicating a manual operational force $F_H$ for each angle α of the lid 10. A plurality of possible examples of such graphical curves is shown in FIG. 2, wherein the X-axis shows the angle α of the lid 10 (called "opening angle tailgate" in FIG. 2) given in degrees and the Y-axis shows the manual operational force $F_H$ (denoted by "handle effort" in FIG. 2) given in Newton.

When a specific manual operational force $F_H$ is selected in dependence on a specific situation, an output unit 24 outputs the armature voltage $u_A$ to the drive unit of the actuator 16 such that the drive unit of the actuator 16 generates a supporting torque M depending on the armature voltage $u_A$.

Changing the armature voltage $u_A$ at a constant speed n of the drive unit of the actuator 16, e.g. increasing it, results in a changed, e.g. increased, torque M of the actuator 16.

Figure 3:
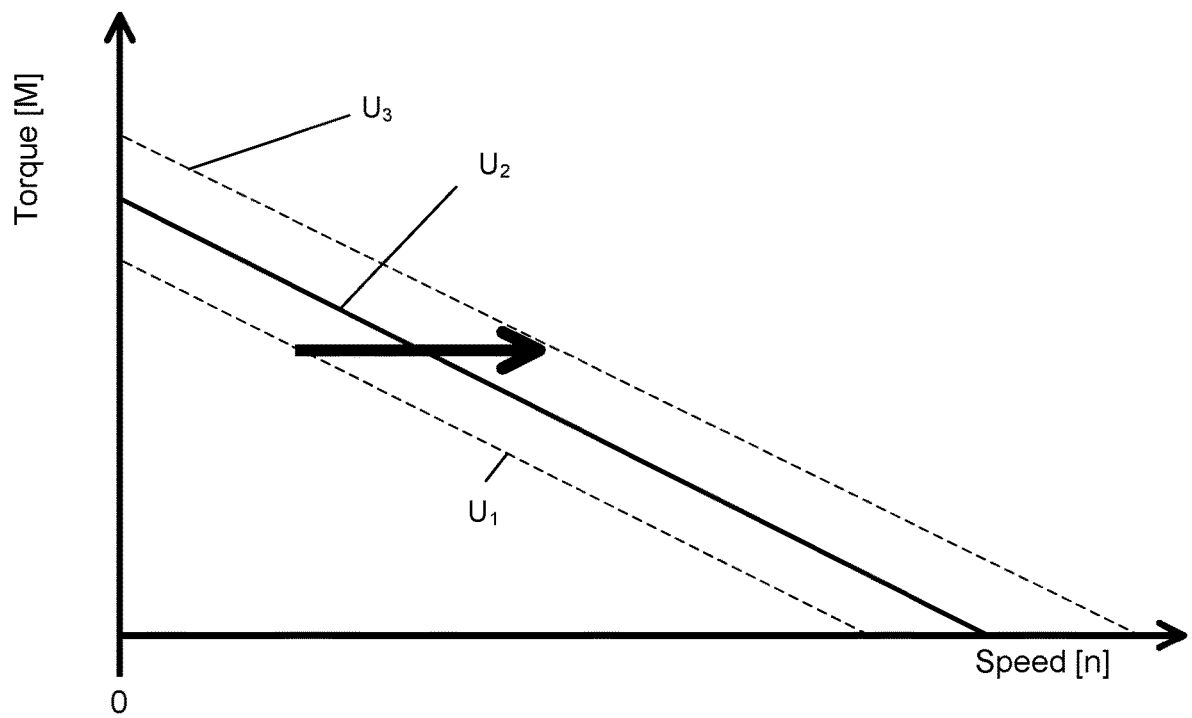
FIG. 3 shows a diagram illustrating the correlation of speed of a drive unit of an actuator, armature voltage and generated torque.

The dependence of the speed of the drive unit of the actuator 16 on the armature voltage $u_A$ resulting in a specific torque M is shown in FIG. 3. The X-axis describes the speed n of the drive unit of the actuator 16 and the Y-axis describes the torque M generated by the actuator 16. The inclined lines running from upper left to lower right of the diagram show different motor characteristics at different armature voltages $u_1$ (lower/left dashed line), $u_2$ (solid line) and $u_3$ (upper/right dashed line), wherein $u_1<u_2<u_3$.

The arrow pointing from the motor characteristic of $u_1$ to the motor characteristic of $u_3$ indicates that increasing the armature voltage $u_A$ at a constant speed n of the drive unit of the actuator 16 results in an increased torque M.

As a result, the supporting forces generated by the actuator 16 according to the present invention may be increased or reduced by increasing or reducing an armature voltage $u_A$ at the drive unit of the actuator 16, as desired.

What is claimed is:

1. An operational force support device, comprising:
   an actuator that comprises a drive unit, a lid that the actuator is coupled to, and a unit to which the lid is linked in a movable manner, and wherein the actuator is adapted to actuate the lid with respect to the unit to which the lid is linked;
   a detection unit that the actuator is connected to and that is adapted to detect a speed of the drive unit of the actuator, while the lid is manually operated, and an angle that the lid is situated in with respect to the unit to which the lid is linked;
   a determination unit that the detection unit is connected to and that is adapted to determine an armature voltage, at which the drive unit of the actuator shall be actuated, in dependence on the speed of the drive unit of the actuator and the angle of the lid with respect to the unit that the lid is linked to and to determine an amplification factor in dependence on the speed of the drive unit of the actuator and the angle of the lid with respect to the unit that the lid is linked to, based on which the armature voltage is determined; and
   an output unit that is connected to the determination unit and that is adapted to output the armature voltage to the drive unit of the actuator such that the drive unit of the actuator generates a supporting torque depending on the armature voltage,
   wherein the armature voltage is determined using the formula $u_A=i*R+K*\theta*n_M$,
   wherein $u_A$ is the armature voltage, i is an applied current, R is a resistance of an electric system of the actuator, K is the amplification factor, $\theta$ is a moment of inertia, and $n_M$ is a manual speed of the drive unit applied by a user to move the lid, and
   wherein the actuator is a linear spindle drive.

2. The operational force support device according to claim 1,
   wherein the supporting torque generated by the drive unit of the actuator is below a torque that is necessary to move the lid at the detected speed solely by the drive unit of the actuator.

3. The operational force support device according to claim 1,
   wherein the operational force support device further comprises:
   a temperature sensor adapted to detect a temperature in a vicinity of the actuator, or
   an inclination sensor adapted to detect an angle that the unit to which the lid is linked is situated in with respect to a gravity direction.

4. The operational force support device according to claim 1,
   wherein the operational force support device further comprises a storage unit in which a look-up table is stored comprising specific values of armature voltages and/or amplification factors in dependence on at least the angle of the lid with respect to the unit to which the lid is linked.

5. A method for adjusting a force that has to be applied by a user to operate a lid, wherein an actuator that is adapted to actuate the lid is coupled to the lid, wherein the method comprises:
   providing the lid, on which the actuator is disposed;
   detecting a speed of a drive unit of the actuator, while the lid is manually operated, and an angle that the lid is situated in with respect to a unit to which the lid is linked;
   determining an amplification factor in dependence on the speed of the drive unit of the actuator and the angle of the lid with respect to the unit to which the lid is linked;
   determining an armature voltage at which the drive unit of the actuator shall be actuated; and
   outputting the armature voltage to the drive unit of the actuator such that the drive unit of the actuator generates a supporting torque depending on the armature voltage,
   wherein the armature voltage is determined using the formula $u_A=i*R+K*\theta*n_M$,
   wherein $u_A$ is the armature voltage, i is an applied current, R is a resistance of an electric system of the actuator, K is the amplification factor, $\theta$ is a moment of inertia, and $n_M$ is a manual speed of the drive unit applied by a user to move the lid, and
   wherein the actuator is a linear spindle drive.

6. The method according to claim 5,
   wherein the supporting torque generated by the drive unit of the actuator is below a torque that is necessary to move the lid at the detected speed solely by the drive unit of the actuator.

7. The method according to claim 5,
   wherein the method further comprises detecting an angle that the unit to which the lid is connected to is situated in with respect to a gravity direction.

8. The method according to claim 5,
   wherein the method further comprises detecting a temperature in a vicinity of the actuator.

9. The method according to claim 5,
   wherein determining the amplification factor comprises selecting a value from a look-up table in dependence on at least the angle of the lid with respect to the unit to which the lid is linked.

10. The method according to claim 5,
    wherein determining the armature voltage at which the drive unit of the actuator shall be actuated comprises selecting a value from a look-up table in dependence on at least the speed of the drive unit of the actuator and the amplification factor.

11. The method according to claim 5,
    wherein the amplification factor or the armature voltage is selected based on a presetting that defines a specific operation force in dependence on at least the angle of the lid.

12. The method according to claim 5,
wherein the lid is a trunk lid of a vehicle adapted to grant or prevent access to a trunk of the vehicle.

\* \* \* \* \*